United States Patent
Shibuya

(10) Patent No.: US 9,620,440 B1
(45) Date of Patent: Apr. 11, 2017

(54) POWER MODULE PACKAGING WITH DUAL SIDE COOLING

(71) Applicant: Texas Instruments Incorporated, Dallas, TX (US)

(72) Inventor: Makoto Shibuya, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/054,117

(22) Filed: Feb. 25, 2016

(51) Int. Cl.
| | |
|---|---|
| G01K 7/01 | (2006.01) |
| H01L 23/495 | (2006.01) |
| H01L 25/065 | (2006.01) |
| H01L 23/31 | (2006.01) |
| H01L 23/367 | (2006.01) |
| H01L 21/48 | (2006.01) |
| H01L 21/56 | (2006.01) |
| H01L 23/00 | (2006.01) |
| H01L 25/00 | (2006.01) |

(52) U.S. Cl.
CPC .... *H01L 23/49568* (2013.01); *H01L 21/4828* (2013.01); *H01L 21/565* (2013.01); *H01L 23/3114* (2013.01); *H01L 23/3675* (2013.01); *H01L 23/49537* (2013.01); *H01L 23/49541* (2013.01); *H01L 23/49575* (2013.01); *H01L 24/32* (2013.01); *H01L 24/83* (2013.01); *H01L 25/0655* (2013.01); *H01L 25/50* (2013.01); *H01L 2224/32245* (2013.01)

(58) Field of Classification Search
CPC ......... H01L 23/49548; H01L 23/49575; H01L 2924/351; H01L 23/49861; H01L 23/495
See application file for complete search history.

(56) References Cited

U.S. PATENT DOCUMENTS

| | | | |
|---|---|---|---|
| 2005/0121701 A1* | 6/2005 | Hirano | G01K 7/01 257/287 |
| 2013/0056885 A1* | 3/2013 | Minamio | H01L 23/4334 257/796 |
| 2014/0346656 A1 | 11/2014 | Eugene Lee et al. | |

OTHER PUBLICATIONS

Madoto Shibuya, "Integrated Clip and Lead and Method of Making a Circuit", U.S. Appl. No. 14/709,074, filed May 11, 2015, pp. 1-17.
"Power Mosfet", Wikipedia, available at https://en.wikipedia.org/wiki/Power_MOSFET on Dec. 29, 2015, pp. 1-8.

(Continued)

*Primary Examiner* — Roy Potter
(74) *Attorney, Agent, or Firm* — Rose Alyssa Keagy; Charles A. Brill; Frank D. Cimino

(57) ABSTRACT

A multichip package includes a first semiconductor device mounted on a first leadframe, in which a primary heat producing surface of the first semiconductor device is oriented towards and in contact with a heat dispersing region of the first leadframe. A second semiconductor device is mounted on a second leadframe, in which a primary heat producing surface of the second semiconductor device is oriented towards and in contact with a heat dispersing region of the second leadframe. A surface of the heat dispersing region of the first leadframe is exposed on a first side of the multichip package, and a surface of the heat dispersing region of the second leadframe is exposed on a second side of the multichip package that is opposite from the first side.

11 Claims, 6 Drawing Sheets

(56) References Cited

OTHER PUBLICATIONS

"High-Performance DrBLADE 5mm × 5mm × 0.6 mm IQFN, TDA21310", Infineon Data Sheet, Revision 2.1, Sep. 5, 2013, pp. 1-24.

Juan A. Herbsommer et al, "Novel Thermally Enhanced Power Package", 2010 Twenty-Fifth Annual IEEE Applied Power Electronics Conference and Exposition (APEC), Palm Springs, CA, Feb. 21-25, 2010, pp. 398-400.

* cited by examiner

POWER MODULE PACKAGING WITH DUAL SIDE COOLING

FIELD OF THE DISCLOSURE

This disclosure relates to compact packaging of integrated circuits that dissipate a large amount of power, and in particular to multifunction devices.

BACKGROUND OF THE DISCLOSURE

Some integrated circuits have no-lead packages such as quad-flat no-leads (QFN) and dual-flat no-leads (DFN) devices that physically and electrically couple integrated circuits to printed circuit boards. Flat no-lead devices, also known as micro leadframe (MLF) and small outline no-leads (SON) devices, are based on a surface-mount technology that connects integrated circuits to the surfaces of printed circuit boards without through-holes in the printed circuit boards. In some examples, flat no-lead packages are near chip scale plastic encapsulated packages typically fabricated with a planar copper leadframe substrate. Perimeter lands on the package provide electrical coupling to the printed circuit board. The lands serve as contacts and may be referred to as leads internal to the integrated circuit; however, the leads do not extend beyond the boundaries of the integrated circuit package.

Some integrated circuits and other electronic devices have conductive clips that are coupled to electronic components within the circuits and devices. The clips may be on one plane and the leads or contacts for the circuits and devices may be on a second plane. The clips are soldered or otherwise electrically and/or mechanically bonded to the leads.

BRIEF DESCRIPTION OF THE DRAWINGS

Particular embodiments in accordance with the invention will now be described, by way of example only, and with reference to the accompanying drawings.

Figure 1:
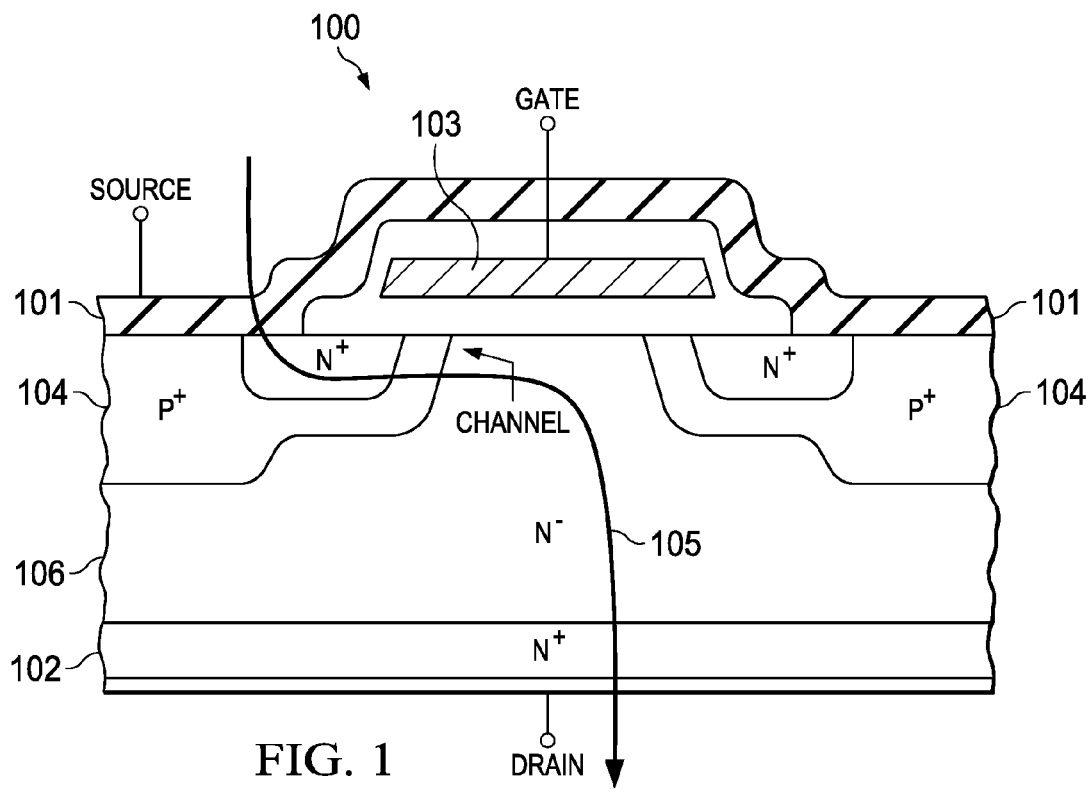
FIG. 1 is a cross sectional view of an exemplary field effect transistor (FET) cell.

Other features of the present embodiments will be apparent from the accompanying drawings and from the detailed description that follows.

DETAILED DESCRIPTION OF EMBODIMENTS OF THE DISCLOSURE

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

A Power MOSFET (metal oxide semiconductor field-effect transistor) may be used as a switch in high current applications, such as automotive, residential, industrial, etc. In many applications, both a high side switch and a low side switch may be needed to control a common device, such as a motor or other type of actuator. In these applications, a cost effective solution may be provided by packaging two power MOSFETs and some control logic in a single small form-factor package. Embodiments of the present disclosure provide small form-factor packages that efficiently dissipates heat produced by two power MOSFETs from a top surface and a bottom surface of the package, as will be described in more detail below.

FIG. 1 is a cross sectional view of an exemplary power MOSFET cell 100. The general operation of power MOSFETs well known; see for example "Power MOSFET", Wikipedia, updated 29 Dec. 2015. A commonly used configuration is a Vertical Diffused MOS (VDMOS) structure (also called Double-Diffused MOS or simply DMOS). MOSFET cell 100 illustrates the "verticality" of the device. Source electrode 101 and an N+ doped source region is placed over the drain electrode 102 and N+ drain region, resulting in a current mainly vertical through body region 106 when the transistor is in the on-state. The P+ wells are obtained by a diffusion process followed by a second diffusion to produce the N+ regions, hence the name double diffused.

Power MOSFETs have a different structure from a typical lateral MOSFET, since their structure is typically vertical and not planar. In a planar structure, the current and breakdown voltage ratings are both functions of the channel dimensions (respectively width and length of the channel), resulting in inefficient use of the silicon real estate. With a vertical structure, the voltage rating of the transistor is a function of the doping and thickness of the N epitaxial layer 106, while the current rating is a function of the channel width. This makes it possible for the transistor to sustain both high blocking voltage and high current within a compact piece of silicon.

$R_n$ is the resistance of the epitaxial layer 106. As the role of this layer is to sustain the blocking voltage, $R_n$ is directly related to the voltage rating of the device. A high voltage MOSFET requires a thick, low-doped layer (i.e. highly resistive), whereas a low-voltage transistor only requires a thin layer with a higher doping level (i.e. less resistive). As a result, $R_n$ is the main factor responsible for the resistance of high-voltage MOSFETs.

Figure 2:
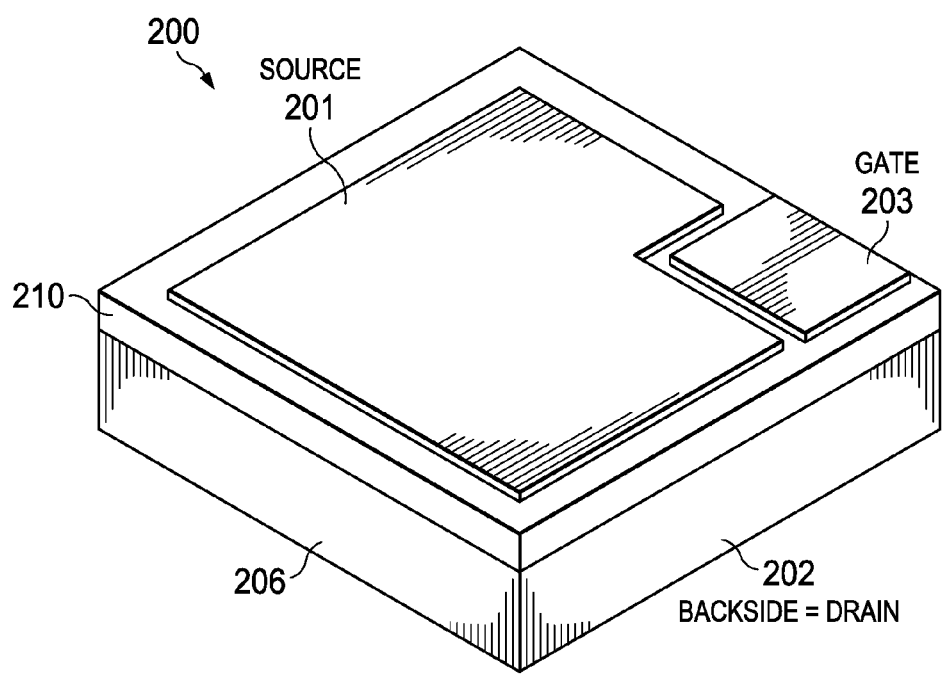
FIG. 2 is a 3D view of an exemplary power device that may include a number of FET cells.

FIG. 2 is a 3D view of an exemplary power MOSFET device 200 that may include a large number of FET cells 100. A common source contact 201 may be provided that contacts the source region of each FET cell. A common drain contact 202 may be provided that contacts the drain region of each FET cell. A gate contact 203 is coupled to the gate of each FET cell. A common drain contact 202 may be provided that contacts the drain region of each FET cell.

When power device 200 is conducting current, heat will be generated in the Source region of each FET cell and in the bulk layer 206 which forms epitaxial region 206 of each FET cell, referring back to FIG. 1, due to the bulk resistance $R_n$. A significant portion of the heat may move to backside drain region 202 because bulk Si has better thermal conductivity than MOLD compound.

Figure 3:
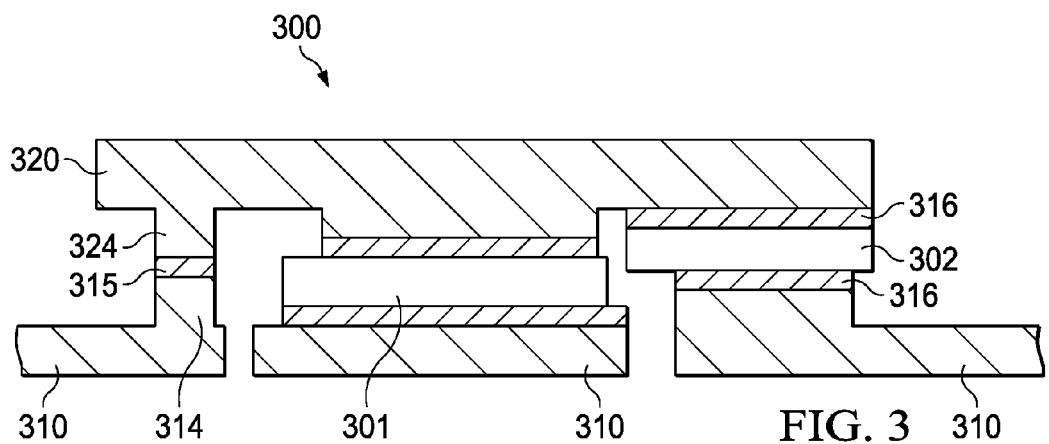
FIGS. 3-4 are side views of an exemplary package that includes two power devices mounted to allow dual side cooling.
Figure 4:
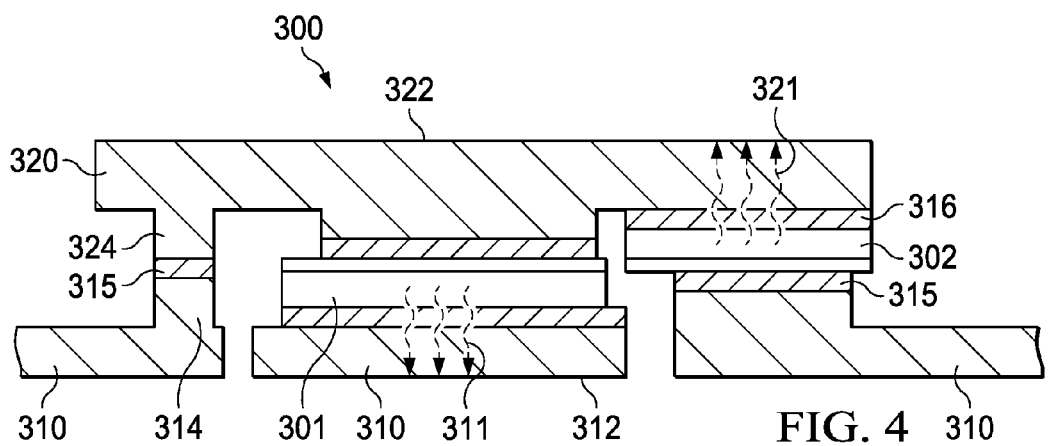

FIGS. 3-4 are side views of an exemplary package 300 that includes two power devices 301, 302 mounted in such a manner as to allow dual side cooling. Power devices 301, 302 may be similar to power MOSFET 200, for example. In this example, power MOSFET 301 is mounted with its drain region coupled to a leadframe 310 and its source region coupled to a separate leadframe 320. This is referred to herein as "face up" orientation. Power MOSFET 302 is mounted with its drain region coupled to leadframe 320 and its source region coupled to separate leadframe 310. This is referred to herein as "face down" orientation.

Referring to FIG. 4, face up FET 301 will tend to dissipate heat through its drain as described above in more detail, as indicated by arrow 311. A region 312 of leadframe 310 that is coupled to and in proximity to MOSFET 301 may therefore provide a heat dispersing region 312 for MOSFET 301. In a similar manner, face down FET 302 will tend to dissipate heat through its drain as described above in more detail, as indicated by arrow 321. A region 322 of leadframe 320 that is coupled to and in proximity to MOSFET 302 may therefore provide a heat dispersing region 322 for MOSFET 302. In this manner, a majority of the heat dissipated by MOSFET 301 may be efficiently dispersed through the bottom side of package 300 while a majority of the heat dissipated by MOSFET 302 may be efficiently dispersed through the top side of package 300. Thus, power module 300 is provided efficient dual side cooling in which the interlock structure encourages heat to be dispersed in two directions.

Referring again to FIG. 3, leadframes 310, 320 may be fabricated by etching a sheet of copper, or other conductive material, to form a desired lead pattern. Furthermore, multiple etch steps may be performed to form a multilevel leadframe in which selected portions have a higher profile, as indicated at 314, 324. In this manner, leadframe 320 may be inverted and mounted on top of leadframe 310 and conductively coupled using solder paste 315, for example, while leaving cavity regions in which power MOSFETs 301, 302 may be placed and conductively coupled using solder paste as indicated at 316. After assembly, the assembly may be heated to reflow the solder paste. The fabrication of multiple etched leadframes is well known; for example, see US Publication 2014-0346656, Lee Han Meng "Multilevel Leadframe," which is incorporated by reference herein.

Figure 5:
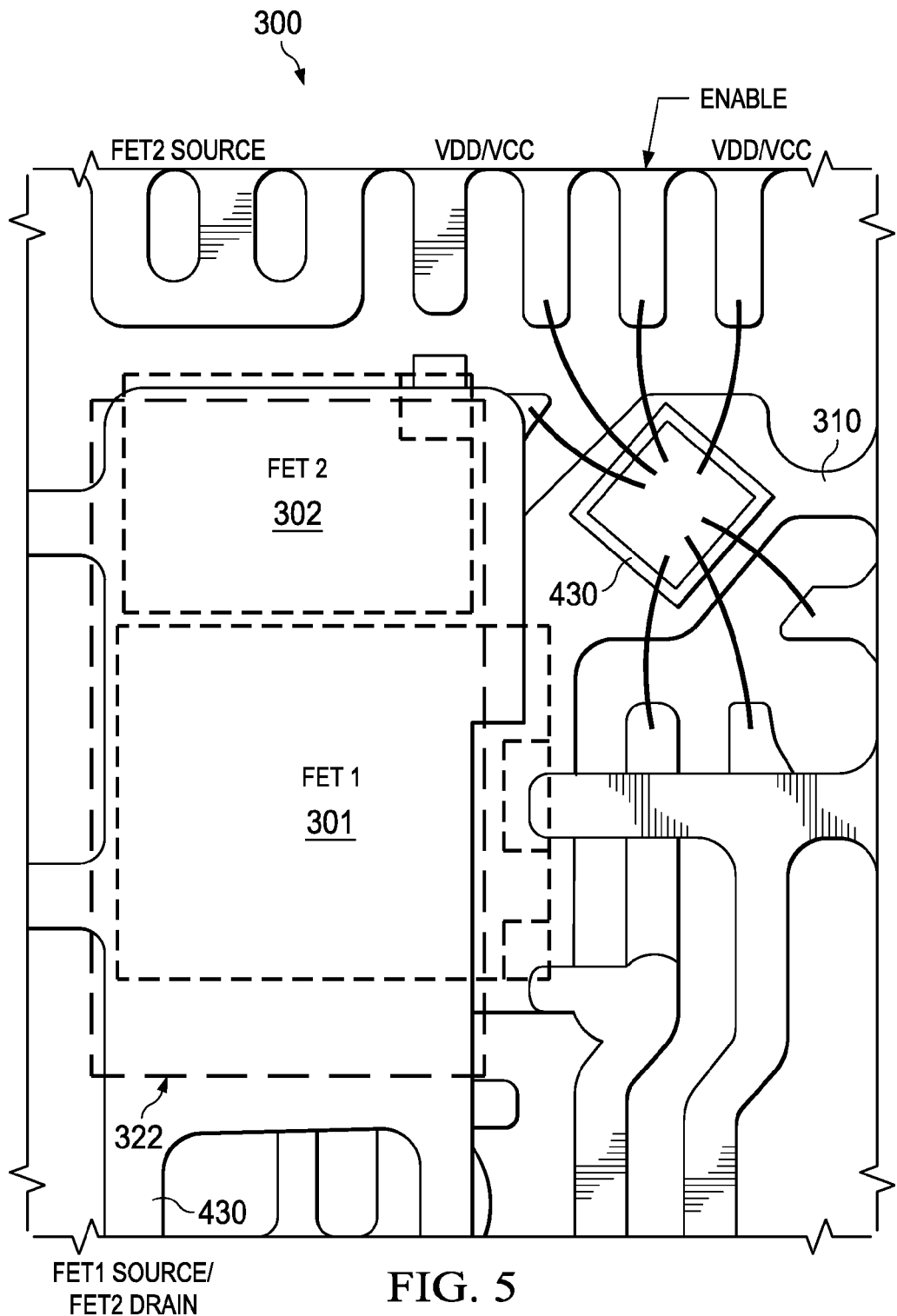
FIG. 5 is a top view of the package of FIGS. 3-4.

FIG. 5 is a top view of the package 300 of FIGS. 3-4. In this view, driver control logic module 430 is illustrated. Driver module 430 controls the operation of MOSFET devices 301, 302. In this manner, two power MOSFET devices 301, 302 and their associated control logic 430 may be packaged together in a single package 300. In this example, package 300 is approximately 5.2×6.0×0.9 mm, which is approximately 38% less volume than a prior device in which both MOSFETs are mounted side by side in a face up manner.

Figure 6:
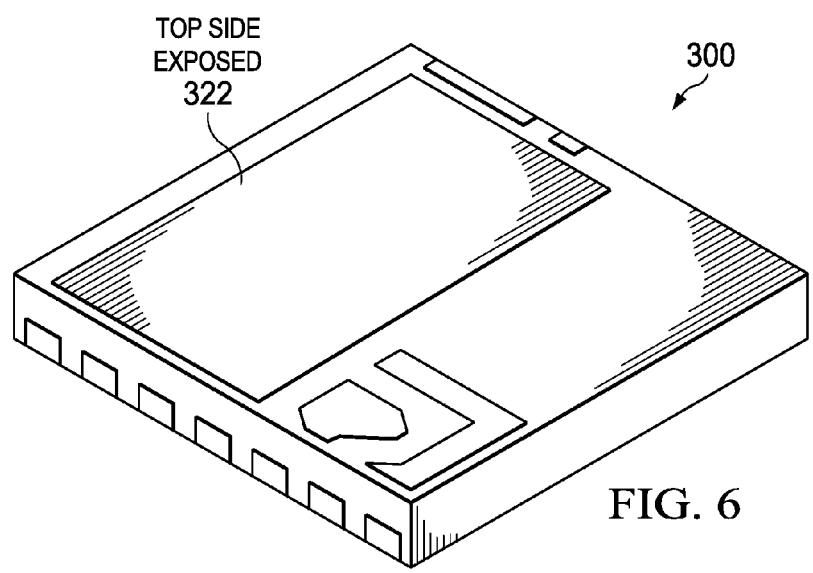
FIG. 6 is a 3D view of a complete molded package.

Power dispersing region 322 is outlined by a dotted rectangle. FIG. 6 is a 3D view of a complete molded package of power module 300. Notice that the package molding is controlled such that power dispersing region 322 is left exposed. In a similar manner, power dispersing region 312 is left exposed on the bottom side of package power module 300. In order to minimize mold flashing over the exposed power dispersing regions, the height of the leadframe assembly is controlled through the reflow process.

Figure 7:
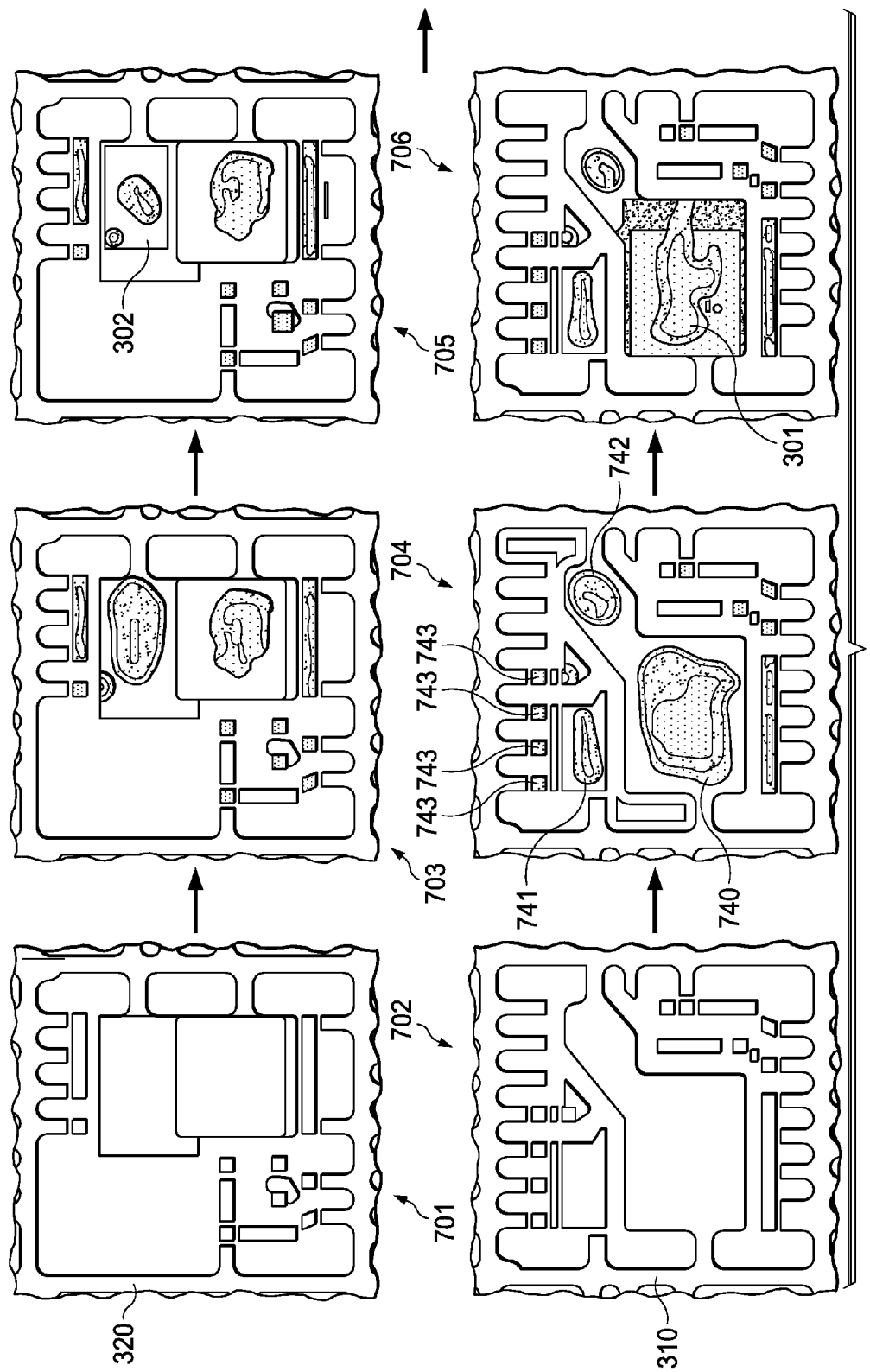
FIGS. 7-9 illustrate a process for fabricating a package with dual side cooling.
Figure 8:
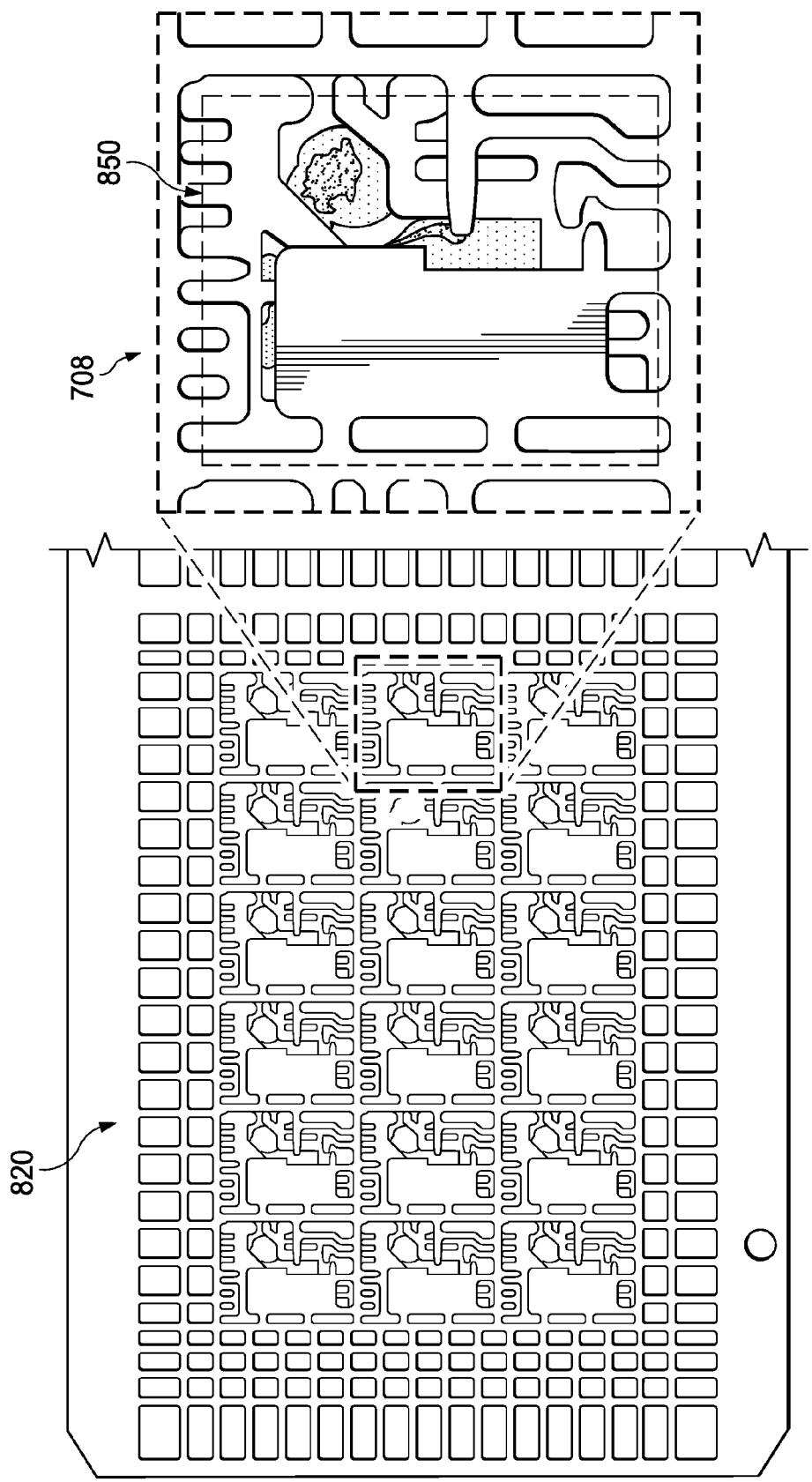
Figure 9:
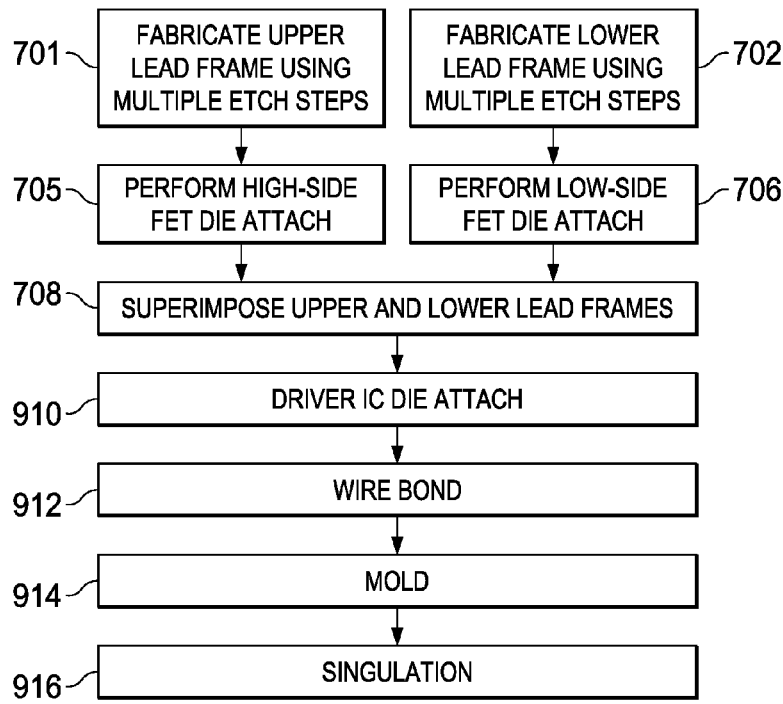

FIGS. 7-9 illustrate a process for fabricating a package with dual side cooling. FIG. 7 illustrates a portion of a copper strip that is formed 701 into a topside leadframe 320, referring again to FIG. 3. Similarly, bottom side leadframe 310 is formed 702. Typically, multiple leadframes will be formed simultaneously on a sheet or strip of conductive material. While a copper sheet is typically used for leadframes, other types of conductive material or alloys of copper may also be used; for example, Cu—Sn, Cu—Fe—P, Cu—Cr—Sn—Zn, etc. Various alloys may be selected to use for a particular application based on conductivity, tinsel strength, thermal expansion rates, etc.

A first etch mask is applied to a conductive sheet that will be used to form a first etched pattern on the sheet. The mask may be formed on the sheet using known application techniques. For example, a photo sensitive mask material may be applied to the sheet and then exposed to light through a reticule that contains an image of the pattern to be etched. Unexposed areas may then be washed away with a suitable solvent. Alternatively, the mask may be applied using a silkscreen process, or other known or later developed application process. Once the first mask is in place, exposed regions of the copper sheet are etched away using suitable etchant. The etch process is allowed to proceed to a depth as that is less than the thickness of the sheet in order to form the various plateaus, also referred to herein as "protruding contact regions", illustrated in FIG. 3. A second and/or third mask and etch sequence may then be performed to complete the leadframes.

Solder paste may then be applied 703 to the top-side leadframe 320 and applied 704 to the bottom-side leadframe 310. For example, on the bottom side leadframe: solder past 740 couples to the drain side of MOSFET 301; solder paste 741 couples to the source contact of MOSFET 302, solder paste 742 couples to driver module 430, and solder paste 743 couples raised plateaus on bottom side leadframe 310 to matching raised plateaus on top side leadframe 320. Various patterns of solder paste may be applied to top side leadframe 320 in a similar manner. Face down MOSFET 302 may then placed in the solder paste on top side leadframe 320 during a die attach process 705, typically by a robotic pick and place machine. Similarly, face up MOSFET 301 may be placed in the solder paste on bottom side leadframe 310 in another die attach process 706. Additional solder paste may be placed over the source contact of MOSFET 301 to aid in coupling to top side leadframe 320. Similarly, additional solder paste may be placed over the source contact of MOSFET 302 to aid in coupling to bottom side leadframe 310.

The top side leadframe is then inverted and superimposed over the bottom side leadframe to form an assembly. FIG. 8 illustrates a portion of a leadframe strip showing a 6×3 matrix of devices 300.

FIG. 9 is flow chart that includes the above steps. After superimposing 708 the leadframes, driver IC 430 may then be placed 910 on the solder paste 742, referring back to FIG. 7. After heating to reflow the solder paste, wirebonding 912 may be performed to connect driver IC 430 to pads on bottom side leadframe 310.

A molding process 914 may then be performed. As discussed with regard to FIG. 6, the leadframe assembly and molding process is controlled such that heat disbursement regions 312, 322 remain exposed to improve heat transfer.

Individual packages may then be produced by singulating 916 the molded leadframe assembly. In this example, singulation 916 may be performed by sawing the outline 850, referring back to FIG. 8.

In this example, the singluated devices are QFN (Quad Flat No leads) packages. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of PCBs without through-holes. Flat no-lead is a near chip scale package plastic encapsulated package made with a planar copper leadframe substrate. Perimeter lands on the package bottom provide electrical connections to the PCB. The QFN package is similar to the quad-flat package, and a ball grid array.

Figure 10:
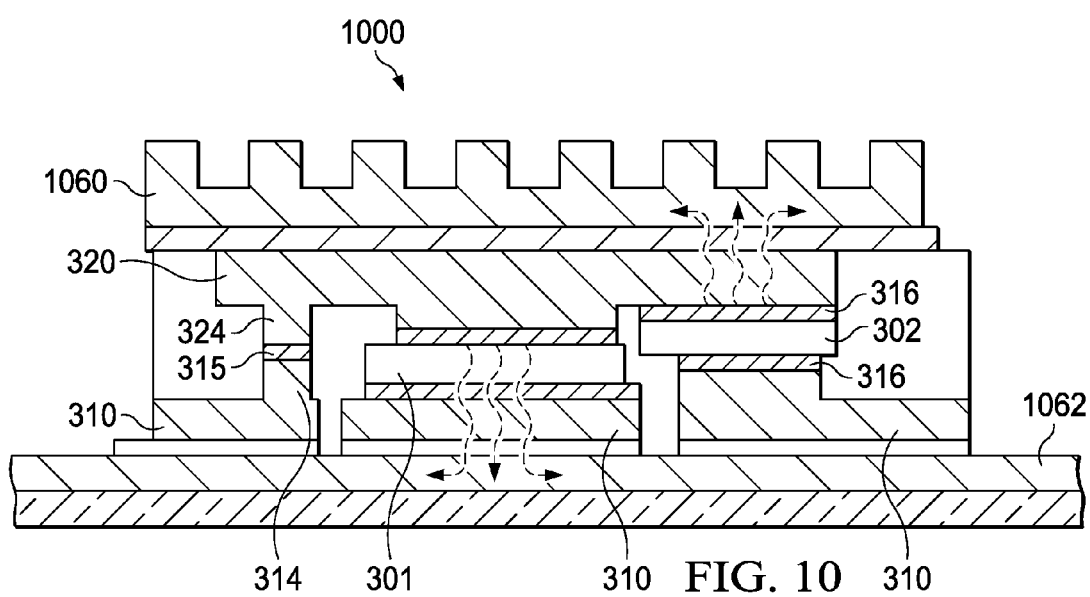
FIG. 10 is a side view of another embodiment of a package with dual side cooling.

FIG. 10 is a side view of another embodiment of a package 1000 with dual side cooling. In this example, an option heat sink 1060 may be attached to the top side heat disbursement region 320 of package 1000 to further assist in heat dissipation. FIG. 10 also illustrates a heat conductive layer 1062 located in a substrate on which package 1000 is mounted. A heat disbursement 310 region on the bottom side of package 1000 may be coupled to heat conductive layer 1062 to assist in heat dissipation. In this example, the substrate may be a printed circuit board (PCB). This substrate may range from an integrated circuit (IC) die, a substrate in a multi-chip package, a printed circuit board (PCB) on which several ICs are mounted, etc., for example. The substrate may be any commonly used or later developed material used for electronic systems and packages, such as: silicon, ceramic, Plexiglas, fiberglass, plastic, metal, etc., for example.

OTHER EMBODIMENTS

While the invention has been described with reference to illustrative embodiments, this description is not intended to be construed in a limiting sense. Various other embodiments of the invention will be apparent to persons skilled in the art upon reference to this description. For example, other package types besides a QFN may be formed with dual side cooling, such as a quad flat package, a ball grid array, etc.

In another embodiment, the lead frames may be formed by a stamping process in which protruding contact regions are formed by bending portions of the lead frame.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A multichip package comprising:
    a first semiconductor device mounted on a first leadframe, in which a primary heat producing surface of the first semiconductor device is oriented towards and in contact with a heat dispersing region of the first leadframe;
    a second semiconductor device mounted on a second leadframe, in which a primary heat producing surface of the second semiconductor device is oriented towards and in contact with a heat dispersing region of the second leadframe;
    in which the first leadframe is a coplanar etched leadframe with protruding contact regions, and the second leadframe is a coplanar etched leadframe with protruding contact regions in contact with corresponding protruding contact regions on the first leadframe; and
    in which a surface of the heat dispersing region of the first leadframe is exposed on a first side of the multichip package, and a surface of the heat dispersing region of the second leadframe is exposed on a second side of the multichip package that is opposite from the first side.

2. The device of claim 1, further including mold material encapsulating the first semiconductor device and the second semiconductor device such that the surface of the heat dispersing surface of the heat sink region of the first leadframe and the surface of the heat dispersing region of the second leadframe remain exposed.

3. The device of claim 2, further including a third semiconductor device interconnected to the first semiconductor device and to the second semiconductor device by the first leadframe and the second leadframe and encapsulated by the mold material.

4. The device of claim 2, further including a heat sink connected to the heat dispersing region of the second leadframe.

5. A method for making a multichip package, the method comprising:
    fabricating an upper leadframe having a heat dispersing region and a lower leadframe having a heat dispersing region by etching a sheet of conductive material;
    attaching a first side of a first chip to the heat dispersing region of the lower leadframe;
    attaching a first side of a second chip to the heat dispersing region of the upper leadframe;
    superimposing the upper lead frame over the lower leadframe such that a second side of the first chip is attached to the heat dispersing region of the second leadframe and a second side of the second chip is attached to the heat dispersing region of the first leadframe to form an assembly; and
    encapsulating the assembly with mold compound such that a surface of the heat dispersing region of the upper leadframe and a surface of the heat dispersing region of the lower leadframe are exposed.

6. A multichip package comprising:
    a first semiconductor device mounted on a first leadframe, in which a drain region of the first semiconductor device is oriented towards and in contact with a heat dispersing region of the first leadframe, and in which a source region of the first semiconductor device is oriented towards and in contact with a second leadframe;
    a second semiconductor device mounted on the second leadframe, in which a drain region of the second semiconductor device is oriented towards and in contact with a heat dispersing region of the second leadframe and in which a source region of the second semiconductor device is oriented towards and in contact with the first leadframe; and in which a surface of the heat dispersing region of the first leadframe is exposed on a first side of the multichip package, and a surface of the heat dispersing region of the second leadframe is exposed on a second side of the multichip package that is opposite from the first side.

7. The multichip package of claim 6, in which the first leadframe is a coplanar etched leadframe with protruding contact regions, and the second leadframe is a coplanar etched leadframe with protruding contact regions in contact with corresponding protruding contact regions on the first leadframe.

8. The multichip package of claim 6, in which the first leadframe is a coplanar stamped leadframe with protruding contact regions, and the second leadframe is a coplanar stamped leadframe with protruding contact regions in contact with corresponding protruding contact regions on the first leadframe.

9. The device of claim 6, further including mold material encapsulating the first semiconductor device and the second semiconductor device such that the surface of the heat dispersing surface of the heat sink region of the first leadframe and the surface of the heat dispersing region of the second leadframe remain exposed.

10. The device of claim 9, further including a third semiconductor device interconnected to the first semiconductor device and to the second semiconductor device by the first leadframe and the second leadframe and encapsulated by the mold material.

11. The device of claim 6, in which the first semiconductor device and the second semiconductor device are both vertical power MOSFET (metal oxide semiconductor field-effect transistor) devices.

* * * * *